(12) United States Patent
Park et al.

(10) Patent No.: US 8,372,748 B2
(45) Date of Patent: Feb. 12, 2013

(54) METHOD FOR FORMING SEMICONDUCTOR DEVICE

(75) Inventors: Dae Jin Park, Icheon (KR); Jong Won Jang, Suwon (KR)

(73) Assignee: Hynix Semiconductor Inc., Icheon (KR)

( * ) Notice: Subject to any disclaimer, the term of this patent is extended or adjusted under 35 U.S.C. 154(b) by 397 days.

(21) Appl. No.: 12/833,940

(22) Filed: Jul. 9, 2010

(65) Prior Publication Data

US 2011/0217842 A1 Sep. 8, 2011

(30) Foreign Application Priority Data

Mar. 8, 2010 (KR) .................. 10-2010-0020385

(51) Int. Cl.
*H01L 21/44* (2006.01)
(52) U.S. Cl. ........ 438/674; 438/202; 438/238; 438/240; 257/208; 257/306; 257/621; 257/E21.646
(58) Field of Classification Search .................. 257/208, 257/306, 390, 621, 646, 776, E21.646; 438/202, 438/238, 240, 243, 257, 381
See application file for complete search history.

(56) References Cited

FOREIGN PATENT DOCUMENTS

| KR | 1020020021816 A | 3/2002 |
|---|---|---|
| KR | 1020040008596 A | 1/2004 |
| KR | 1020090091555 A | 8/2009 |
| KR | 1020090094585 A | 9/2009 |

*Primary Examiner* — Evan Pert
*Assistant Examiner* — Mark A Laurenzi (57) ABSTRACT

A method for manufacturing semiconductor device includes forming an interlayer dielectric layer including a contact plug defined therein to electrically couple a semiconductor substrate on which a cell region and a dummy region are defined. A sacrificial layer is formed over the interlayer dielectric layer. An etch stop pattern is formed over the sacrificial layer, the etch stop pattern being vertically aligned to the dummy region. A storage electrode region through the sacrificial layer is defined to expose a first storage electrode contact of the cell region, the second storage electrode contact of the dummy region remaining covered by the sacrificial layer. A conductive layer is deposited within the storage electrode region to form a storage electrode contacting the first storage electrode contact of the cell region.

12 Claims, 7 Drawing Sheets

METHOD FOR FORMING SEMICONDUCTOR DEVICE

CROSS-REFERENCES TO RELATED APPLICATIONS

The present application claims priority to Korean patent application number 10-2010-0020385, filed on 8 Mar. 2010, which is incorporated by reference in its entirety.

BACKGROUND OF THE INVENTION

The present invention relates to a method for manufacturing a semiconductor device, and more particularly, to a method for forming a storage electrode.

In recent years, as semiconductor devices become more and more integrated, a reduction in a design rule is being rapidly achieved. Accordingly, there is a need to implement an ultra fine pattern. In particular, in order to secure a process margin in a memory device such as a dynamic random access memory (DRAM) device, a procedure disposing a dummy pattern around a real pattern is recognized as an important factor.

Figure 1:
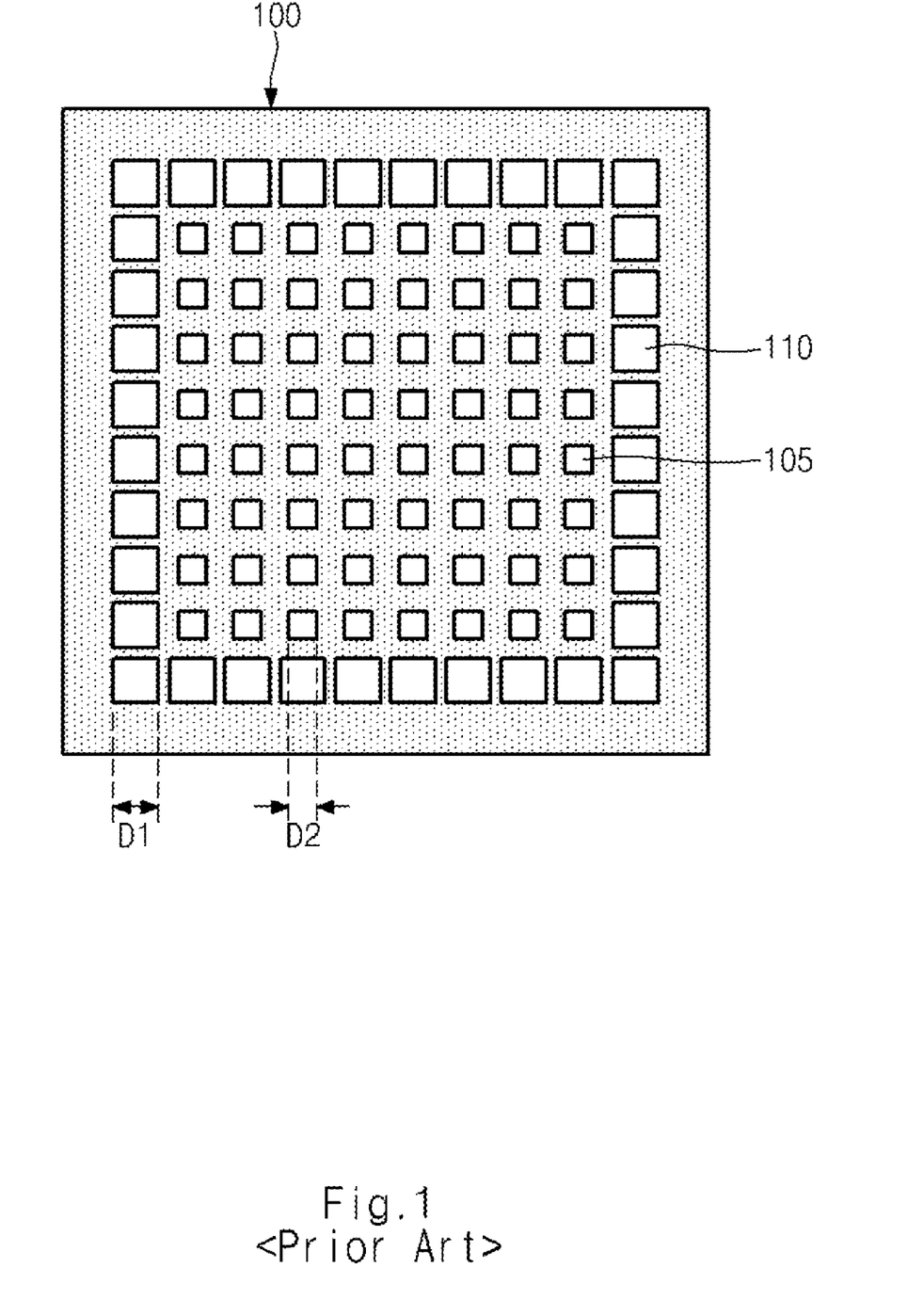
FIG. 1 is a layout view illustrating an exposure mask for a storage electrode according to a related art.

FIG. 1 is a layout view illustrating an exposure mask for a storage electrode according to the related art. Referring to FIG. 1, the exposure mask 100 is used to form a storage electrode region. A plurality of first transparent patterns 105 defining a storage electrode region are provided. A second transparent pattern 110 having a critical dimension CD(d1) larger than a CD(d2) of the first transparent pattern 105 in an outermost zone of the cell region. Since patterns formed at the outermost zone is weak in an exposure process, the pattern CD on the exposure mask is formed larger than that of a CD of a final desired pattern.

In a conventional method for manufacturing a semiconductor device as described above, a process margin in decreased due to a difference in CD of a storage electrode region formed at a middle part of the cell region and a CD of a storage electrode formed at the outermost zone of the cell region. Accordingly, when forming the storage electrode, a bunker defect and column fail can occur due to an inaccurate Self Aligned Contact (SAC) process between the storage electrode and a bit line. These defects deteriorate the characteristics of the semiconductor device.

BRIEF SUMMARY OF THE INVENTION

Embodiments of the present invention are directed to a method for manufacturing a semiconductor that may secure a process margin by forming a dummy region at an outer part of a cell region and to forming a storage electrode region of the dummy region having the same size as that of a storage electrode region of the dummy region, in which formation of unnecessary storage electrode region is not formed not to etch the storage electrode region of the dummy region.

According to an embodiment of the present invention, a method for manufacturing a semiconductor device includes: forming an interlayer dielectric layer including a contact plug defined therein to electrically couple a semiconductor substrate on which a cell region and a dummy region are defined; forming a sacrificial layer over the interlayer dielectric layer; forming an etch stop pattern over the sacrificial layer, the etch stop pattern being vertically aligned to the dummy region; defining a storage electrode region trough the sacrificial layer to expose a first storage electrode contact of the cell region, the a second storage electrode contact of the dummy region remaining covered by the sacrificial layer; and depositing a conductive layer in the storage electrode region to form a storage electrode contacting the first storage electrode contact of the cell region.

Forming an etch stop layer pattern opening the cell region at an upper portion of the sacrificial layer; forming a hard mask defining a storage electrode region at an upper portion of the sacrificial oxide layer including the etch stop layer, the hard mask pattern being formed to expose the sacrificial oxide layer of the cell region and the etch stop layer pattern of the dummy region; and etching the exposed sacrificial oxide by using the hard mask pattern as a mask to form a storage electrode region at the cell region.

Forming the storage electrode comprises: forming the conductive layer over the sacrificial layer and within the storage electrode hole; and performing an etch-back process at least until the sacrificial layer is exposed.

Forming the storage electrode comprises: forming the conductive layer over the sacrificial layer and in the storage electrode hole; and performing an etch-back process at least until the sacrificial layer is exposed. The etch stop pattern is formed using an exposure mask including a plurality of transparent patterns defining the cell region. The plurality of transparent patterns of the cell regions have substantially the same shape, pitch, and size. The hard mask pattern is formed using an exposure mask including a plurality of transparent patterns defining a storage electrode region in the cell region and the dummy region. The transparent patterns of the cell region and transparent patterns of the dummy region have substantially the same shape, pitch, and size. The sacrificial layer includes a phosphor-silicate glass (PSG) layer, a tetraethyl ortho-silicate (TEOS) layer, or a stack structure thereof. The etch stop layer includes a nitride layer and the sacrificial layer includes an oxide layer. The hard mask pattern includes carbon material. The dummy region does not have a storage electrode contacting the second storage electrode contact. The conductive layer includes a titanium nitride (TiN) layer.

DESCRIPTION OF EMBODIMENTS

Hereinafter, a method for manufacturing a semiconductor device according to an embodiment of the present invention will be described with reference to accompanying drawings.

Figure 2A:
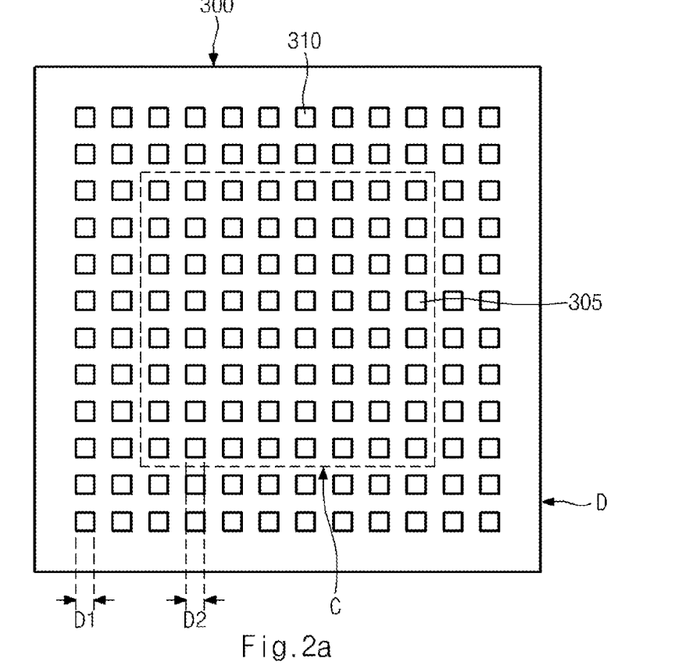
FIG. 2a and FIG. 2b are layout views illustrating an exposure mask according to an embodiment of the present invention.
Figure 2B:
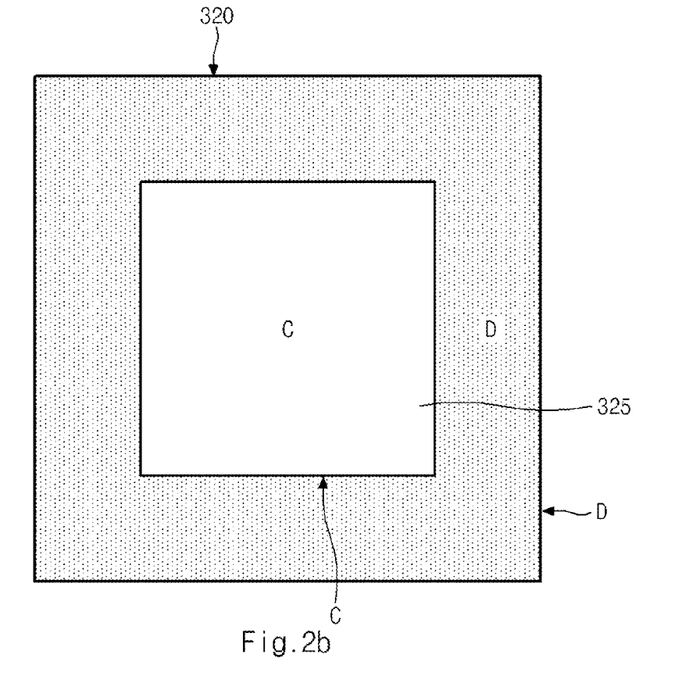

FIG. 2a and FIG. 2b are layout views illustrating an exposure mask according to an embodiment of the present invention.

Referring to FIG. 2a, an exposure mask 300 defines a storage electrode region. A plurality of transparent patterns 305, 310 are formed in a cell region C and a dummy region D. A plurality of first transparent patterns 305 defining a storage electrode region in a target substrate is disposed at a cell region C. A plurality of second transparent patterns 310 defining dummy storage electrode regions in the target substrate are disposed at a dummy region D at a peripheral part of the cell region C. The dummy region D is located at a peripheral area of the cell region and the cell region C is surrounded by the dummy region D.

In this case, the first and the second transparent patterns 305 which are formed in the cell C and the dummy region D, respectively, have the same shape, the same pitch, and the same size. Namely, conventionally, the size of a pattern in the outer most zone of the cell region is formed to be larger than that of a middle zone. However, the patterns therein are formed to have the same size.

Further, a critical dimension CD (D1) of the dummy region D has the same shape, pitch, and size as those of a CD(D2) of the cell region C. In this case, the second transparent pattern 310 defining the dummy storage electrode region in the target substrate is preferably formed with such a width that the most outer pattern in the cell region C can be subject to an optical proximity effect. As mentioned above, since the first transparent pattern 300 and the second transparent pattern 310 may be formed to have the same size at the cell region C and at the dummy region D, respectively, equal process margins in both of the cell region C and the dummy region D can be secured.

FIG. 2b is a view illustrating an exposure mask with a transparent pattern 325 defining the cell region C. The exposure mask is used to form an etch stop layer pattern for prohibiting an unnecessary storage electrode region from being formed at a subsequent procedure.

FIG. 3a to FIG. 3e are cross-sectional views illustrating a method for manufacturing a semiconductor device according to the present invention using an exposure mask of FIGS. 2a and 2b.

Figure 3A:
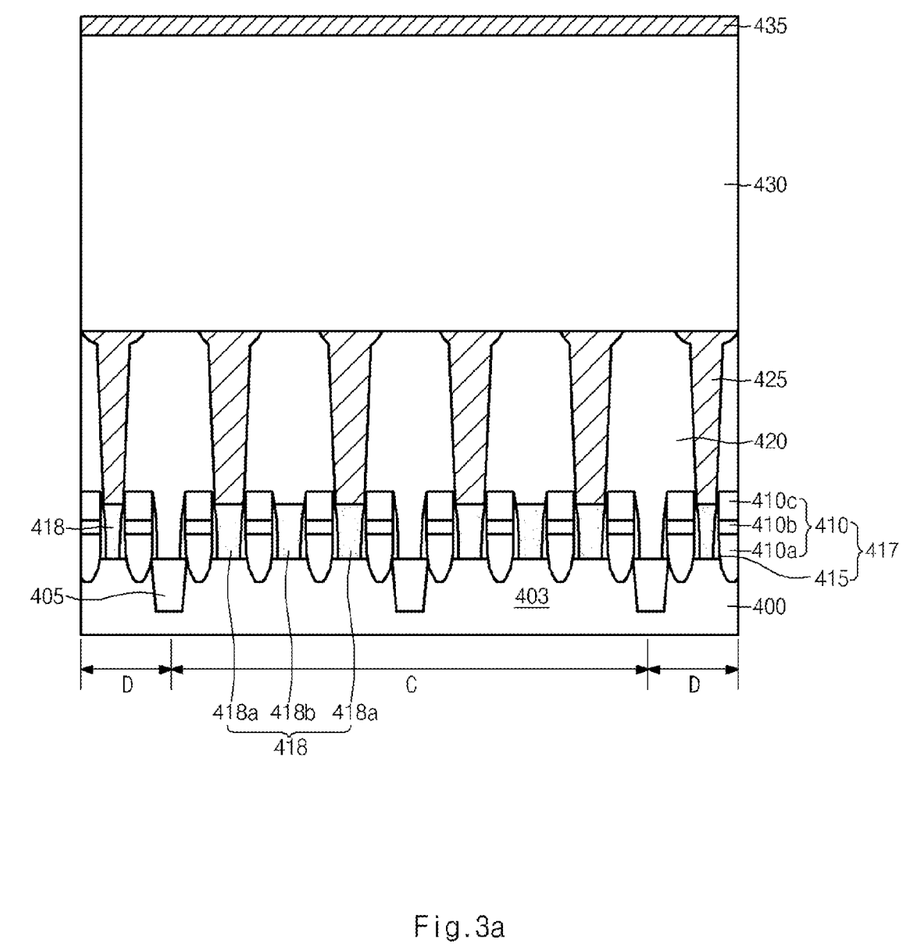
FIG. 3a to FIG. 3e are cross-sectional views illustrating a method for manufacturing a semiconductor device according to the present invention.

Referring to FIG. 3a, a gate structure 417 is formed at an upper portion of a semiconductor substrate 400 in a cell region. The cell region C includes an active region 403 and a device isolation layer 405. The gate structure 417 includes a gate pattern 410 and a spacer 415. The gate pattern 410 is formed by stacking a gate poly-silicon layer 410a, a gate conductive layer 410b, and a gate hard mask layer 410c. The spacer 415 is deposited at a sidewall of the gate pattern 410. An insulating layer (not shown) is formed at an upper entire part with the gate structure 417, and a mask pattern (not shown) is formed at an upper portion of the insulating layer to expose a landing plug contact region.

The insulating layer is etched by using a mask pattern (not shown) as an etch mask to form a landing plug contact hole exposing the active region 403 of the semiconductor substrate 400. A poly-silicon layer is formed filling the landing plug contact hole, and a planarizing process is performed to form a landing plug contact 418. At this time, a landing plug contact 418 formed at one side of the gate structure 417 is used as a landing plug contact 418b for a bit line. A landing plug contact 418 disposed at the other side of the gate structure 417 is for a storage electrode.

Next, a first interlayer dielectric layer 420 is formed on the semiconductor substrate 400 with the gate structure 417 and the landing plug contact 418.

Then, after the first interlayer dielectric layer 420 is etched, a conductive material is buried to form a storage electrode contact 425 to be connected with the landing plug contact 418 for a storage electrode.

Subsequently, a buffer oxide layer (not shown) and a sacrificial oxide layer 430 are formed on the first interlayer dielectric layer 420 on which the storage electrode contact 425 is formed. Here, the sacrificial oxide layer 430 is preferably formed of a phosphor-silicate glass (PSG) layer, a tetra-ethyl ortho-silicate (TEOS) layer, or a stack structure thereof.

Next, an etch stop layer 435 is formed on the sacrificial oxide layer 430. Here, the etch stop layer 435 is preferably formed of a material with a nitride layer. This is to provide an etch selectivity difference from the sacrificial oxide layer 430.

Next, a first photo resist (not shown) is formed at an upper portion of the etch stop layer 435. Then, exposure and development processes using a first exposure mask 320 shown in FIG. 2b are performed to form a first photo resist pattern (not shown) defining a cell region C and a dummy region D. The dummy region D is formed at a peripheral area of the cell region and the cell region C is surrounded by the dummy region.

Figure 3B:
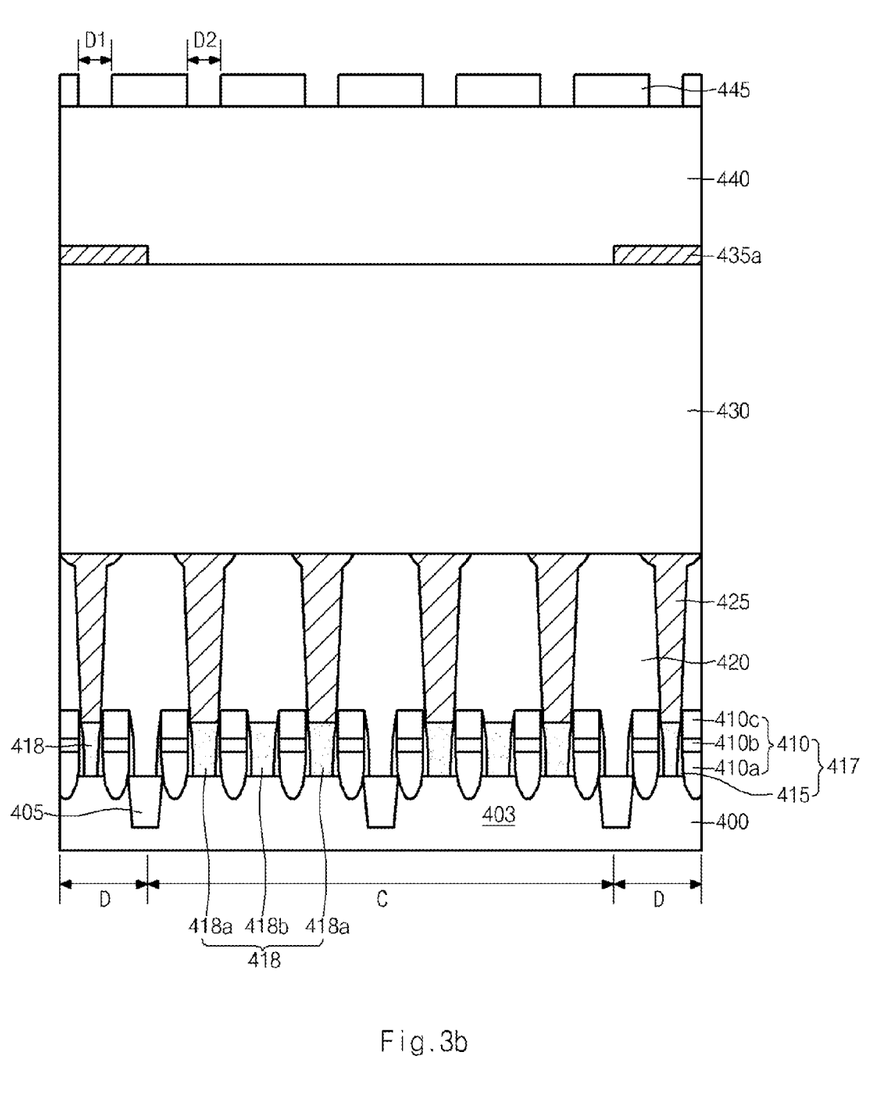

Next, referring to FIG. 3b, the etch stop layer 435 is etched by using the first photo resist pattern (not shown) as a mask to from an etch stop pattern 435a exposing the cell region C. Namely, the etch stop pattern 435a is formed on the dummy region D. Subsequently, the first photo resist pattern (not shown) is removed.

A hard mask layer 440 is formed at an upper portion with the etch stop pattern 435a. Here, the hard mask layer 440 is preferably formed of an amorphous carbon layer (a-Carbon), a silicon oxide nitride layer (SiON), or a stack structure thereof.

Next, a second photo resist (not shown) is formed at an upper portion of the hard mask layer 440. Further, exposure and development processes using a second exposure mask shown in FIG. 2a are performed to from a second photo resist pattern 445. In this case, referring to FIG. 3a, since the first transparent pattern 305 of the cell region C and the second transparent pattern 310 of the dummy region D have the same shape, the same pitch, and the same size, a uniform process margin can be secured between the cell region C and the dummy region D.

Figure 3C:
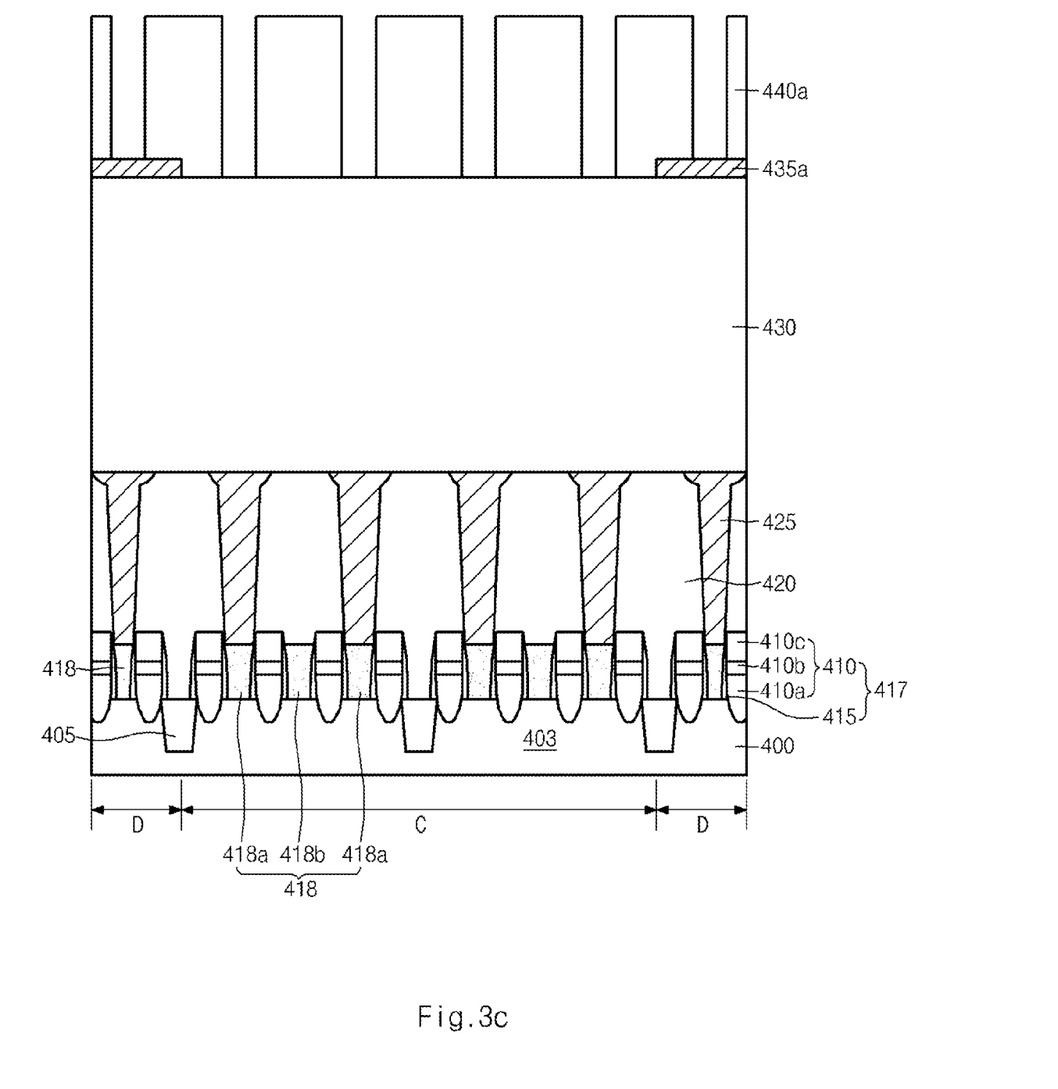
Figure 3D:
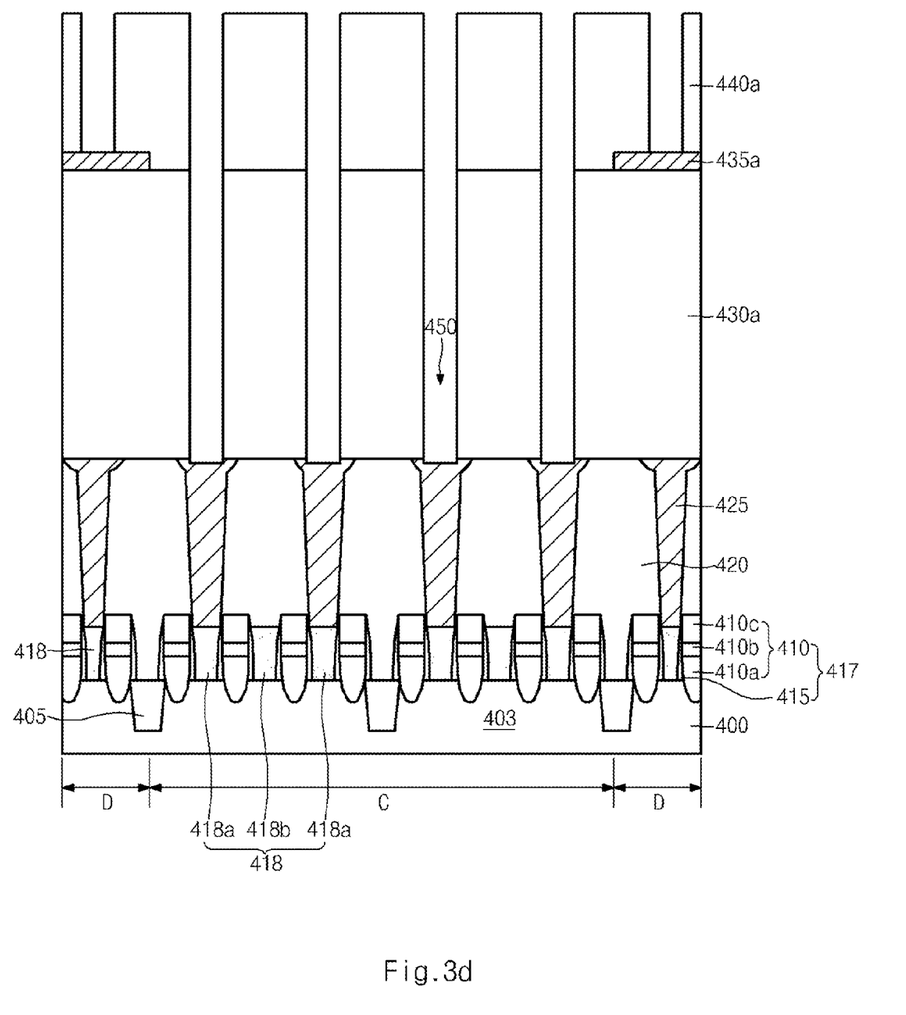

Referring to FIG. 3c and FIG. 3d, the hard mask layer 440 is etched by using the second photo resist pattern 445 as a mask to form a hard mask pattern 440a. Next, the second photo resist pattern 445 is removed. In this case, the hard mask pattern 440a defines storage electrode regions in the cell region C and the dummy region D. In the cell region C, the sacrificial oxide layer 430 is exposed between the hard mask patterns 440a. In the dummy region D, the etch stop pattern 435a is exposed between the hard mask patterns 440a.

Next, referring to FIG. 3d, the exposed sacrificial oxide layer 430 in the cell region C is etched by using the hard mask pattern 440a as a mask to form a sacrificial oxide layer pattern 430a, thereby forming a storage electrode region 450 exposing the storage electrode contact 425. At this time, since the etch stop pattern 435a is formed at the dummy region D, the sacrificial oxide layer 430 in the dummy region D is not etched. Namely, the storage electrode region 450 is formed at only the cell region C.

Figure 3E:
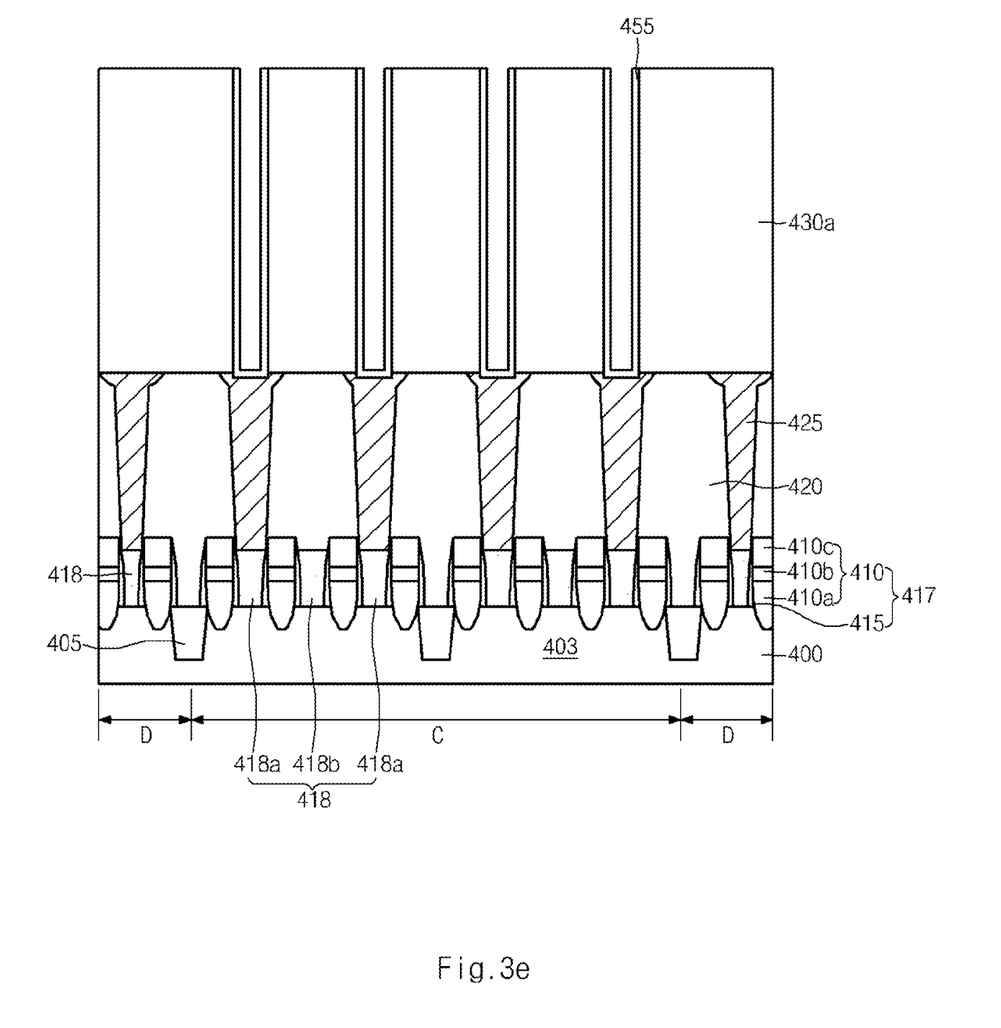

Referring to FIG. 3e, a conductive layer for a storage electrode (not shown) is deposited at surfaces of the sacrificial oxide layer pattern 430a and the hard mask pattern 440a including the storage electrode region 450. The conductive layer for the storage electrode is preferably formed of a material containing a titanium nitride (TiN) layer.

Subsequently, an etch-back process is performed until the sacrificial oxide layer 430 is exposed to isolate the conductive layer for the storage electrode (not shown), which results in formation of a storage electrode 455. At this time, both of the etch stop pattern 435a and the hard mask pattern 440a at an upper portion of the sacrificial oxide layer pattern 430a are removed.

As is clear from the forgoing description, the storage electrode region 450 having the same size is formed at the cell region C and the dummy region D, thereby securing a uniform process margin. Conventionally, a storage electrode region 450 is formed not only in the cell region C, but also in the dummy region D. The formation of the storage electrode region 450 is not necessary. In contrast, in an embodiment of the present invention, in an etch stop pattern blocking the dummy region D, an unnecessary storage electrode region 450 is prevented from being formed in the dummy region D.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing semiconductor device, comprising:
    forming an interlayer dielectric layer including a contact plug defined therein to electrically couple a semiconductor substrate on which a cell region and a dummy region are defined;
    forming a sacrificial layer over the interlayer dielectric layer;
    forming an etch stop pattern over the sacrificial layer, the etch stop pattern being vertically aligned to the dummy region;
    defining a storage electrode region through the sacrificial layer to expose a first storage electrode contact of the cell region, whereas a second storage electrode contact of the dummy region remains covered by the sacrificial layer; and
    depositing a conductive layer in the storage electrode region to form a storage electrode contacting the first storage electrode contact of the cell region.

2. The method of claim 1, further comprising:
    forming an etch stop layer over the sacrificial layer to form the etch stop pattern;
    forming a hard mask pattern over the etch stop pattern and the sacrificial layer, the hard mask pattern exposing a portion of the sacrificial layer and a portion of the etch stop pattern; and
    etching the exposed portion of the sacrificial layer to form the storage electrode hole while a portion of the sacrificial layer provided below the exposed etch stop pattern remains not etched and covering the second storage electrode contact.

3. The method of claim 1, wherein forming the storage electrode comprises:
    forming the conductive layer over the sacrificial layer and in the storage electrode hole; and
    performing an etch-back process at least until the sacrificial layer is exposed.

4. The method of claim 2, wherein the etch stop pattern is formed using an exposure mask including a plurality of transparent patterns defining the cell region.

5. The method of claim 4, wherein the plurality of transparent patterns of the cell regions have substantially the same shape, pitch, and size.

6. The method of claim 2, wherein the hard mask pattern is formed using an exposure mask including a plurality of transparent patterns defining a storage electrode region in the cell region and the dummy region.

7. The method of claim 6, wherein transparent patterns of the cell region and transparent patterns of the dummy region have substantially the same shape, pitch, and size.

8. The method of claim 1, wherein the sacrificial layer includes a phosphor-silicate glass (PSG) layer, a tetraethyl ortho-silicate (TEOS) layer, or a stack structure thereof.

9. The method of claim 2, wherein the etch stop layer includes a nitride layer and the sacrificial layer includes an oxide layer.

10. The method of claim 2, wherein the hard mask pattern includes carbon material.

11. The method of claim 2, wherein the dummy region does not have a storage electrode contacting the second storage electrode contact.

12. The method of claim 1, wherein the conductive layer includes a titanium nitride (TiN) layer.

* * * * *